US009818884B2

(12) United States Patent
Le et al.

(10) Patent No.: US 9,818,884 B2
(45) Date of Patent: Nov. 14, 2017

(54) STRAIN COMPENSATION IN TRANSISTORS

(71) Applicant: Intel Corporation, Santa Clara, CA (US)

(72) Inventors: Van H. Le, Beaverton, OR (US); Benjamin Chu-Kung, Hillsboro, OR (US); Jack T. Kavalieros, Portland, OR (US); Ravi Pillarisetty, Portland, OR (US); Willy Rachmady, Beaverton, OR (US); Harold W. Kennel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/120,818

(22) PCT Filed: Mar. 28, 2014

(86) PCT No.: PCT/US2014/032129
§ 371 (c)(1),
(2) Date: Aug. 23, 2016

(87) PCT Pub. No.: WO2015/147851
PCT Pub. Date: Oct. 1, 2015

(65) Prior Publication Data
US 2016/0372607 A1  Dec. 22, 2016

(51) Int. Cl.
*H01L 21/00* (2006.01)
*H01L 29/00* (2006.01)
(Continued)

(52) U.S. Cl.
CPC ........ *H01L 29/78696* (2013.01); *B82Y 10/00* (2013.01); *B82Y 40/00* (2013.01);
(Continued)

(58) Field of Classification Search
CPC ... B82Y 10/00; B82Y 40/00; H01L 21/02381; H01L 21/0245; H01L 21/02461;
(Continued)

(56) References Cited

U.S. PATENT DOCUMENTS 7,767,560 B2 *  8/2010  Jin ................... B82Y 10/00
                                         257/E21.103
8,324,661 B2 * 12/2012  Radosavljevic .. H01L 29/66462
                                         257/192
(Continued)

FOREIGN PATENT DOCUMENTS

JP      2012089779      5/2012

OTHER PUBLICATIONS

International Searching Authority, "Notification of Transmittal of the International Search Report and the Written Opinion of the International Searching Authority," dated Dec. 23, 2014 in International application No. PCT/US2014/032129.
(Continued)

*Primary Examiner* — Nikolay Yushin
(74) *Attorney, Agent, or Firm* — Trop, Pruner & Hu, P.C.

(57) ABSTRACT

An embodiment includes a device comprising: a first epitaxial layer, coupled to a substrate, having a first lattice constant; a second epitaxial layer, on the first layer, having a second lattice constant; a third epitaxial layer, contacting an upper surface of the second layer, having a third lattice constant unequal to the second lattice constant; and an epitaxial device layer, on the third layer, including a channel region; wherein (a) the first layer is relaxed and includes defects, (b) the second layer is compressive strained and the third layer is tensile strained, and (c) the first, second, third, and device layers are all included in a trench. Other embodiments are described herein.

25 Claims, 4 Drawing Sheets

(51) Int. Cl.

| | | |
|---|---|---|
| *H01L 29/786* | (2006.01) | |
| *H01L 21/02* | (2006.01) | |
| *B82Y 10/00* | (2011.01) | |
| *B82Y 40/00* | (2011.01) | |
| *H01L 29/423* | (2006.01) | |
| *H01L 29/66* | (2006.01) | |
| *H01L 29/775* | (2006.01) | |
| *H01L 29/06* | (2006.01) | |
| *H01L 29/10* | (2006.01) | |
| *H01L 29/165* | (2006.01) | |
| *H01L 29/78* | (2006.01) | |
| *H01L 29/15* | (2006.01) | |

(52) U.S. Cl.
CPC .... *H01L 21/0245* (2013.01); *H01L 21/02381* (2013.01); *H01L 21/02461* (2013.01); *H01L 21/02463* (2013.01); *H01L 21/02466* (2013.01); *H01L 21/02505* (2013.01); *H01L 21/02532* (2013.01); *H01L 21/02543* (2013.01); *H01L 21/02546* (2013.01); *H01L 29/0673* (2013.01); *H01L 29/1054* (2013.01); *H01L 29/155* (2013.01); *H01L 29/165* (2013.01); *H01L 29/42364* (2013.01); *H01L 29/42392* (2013.01); *H01L 29/66439* (2013.01); *H01L 29/66742* (2013.01); *H01L 29/66772* (2013.01); *H01L 29/775* (2013.01); *H01L 29/7849* (2013.01); *H01L 29/78603* (2013.01); *H01L 29/78618* (2013.01); *H01L 29/78684* (2013.01)

(58) Field of Classification Search
CPC ......... H01L 21/02463; H01L 21/02466; H01L 21/02505; H01L 21/02532; H01L 21/02543; H01L 21/02546; H01L 29/165; H01L 29/42392; H01L 29/66772; H01L 29/7849; H01L 29/78603; H01L 29/155; H01L 29/66742; H01L 29/78618; H01L 29/78684; H01L 29/78696; H01L 29/42364; H01L 29/66439; H01L 29/775; H01L 29/0673; H01L 29/1054
See application file for complete search history.

(56) References Cited

U.S. PATENT DOCUMENTS

| | | |
|---|---|---|
| 2005/0158971 A1 | 7/2005 | Lin et al. |
| 2008/0073667 A1 | 3/2008 | Lochtefeld |
| 2008/0187018 A1 | 8/2008 | Li |
| 2009/0085027 A1* | 4/2009 | Jin ................. B82Y 10/00 257/24 |
| 2013/0134480 A1 | 5/2013 | Hydrick et al. |

OTHER PUBLICATIONS

Taiwan Intellectual Property Office, Office Action dated May 20, 2016 in Taiwan Patent Application No. 104105368.

* cited by examiner

STRAIN COMPENSATION IN TRANSISTORS

FIELD OF THE INVENTION

Embodiments of the invention relate generally to integrated circuit devices, and more specifically to transistors, multigate transistors, PMOS and NMOS transistors, and nanoribbon and nanowire transistors.

BACKGROUND

The push towards ever-smaller and more highly integrated circuits (IC) places enormous demands on the techniques and materials used to construct the devices that form those ICs. Such ICs are found in chips incorporated in a variety of common devices, such as computers, cars, televisions, game systems, diodes, lasers, photodetectors, magnetic field sensors, CD players, wearable electronics (e.g., Smartwatches and eyeglasses), Smartphones, and, more generally, mobile computing nodes. Components of these chips include, for example, transistors (e.g., CMOS (complementary metal-oxide-semiconductor) devices), capacitive structures, resistive structures, and metal lines that provide electronic connections between components of ICs and external devices.

BRIEF DESCRIPTION OF THE FIGURES

Features and advantages of embodiments of the present invention will become apparent from the appended claims, the following detailed description of one or more example embodiments, and the corresponding figures, in which:

DETAILED DESCRIPTION

Figure 1:
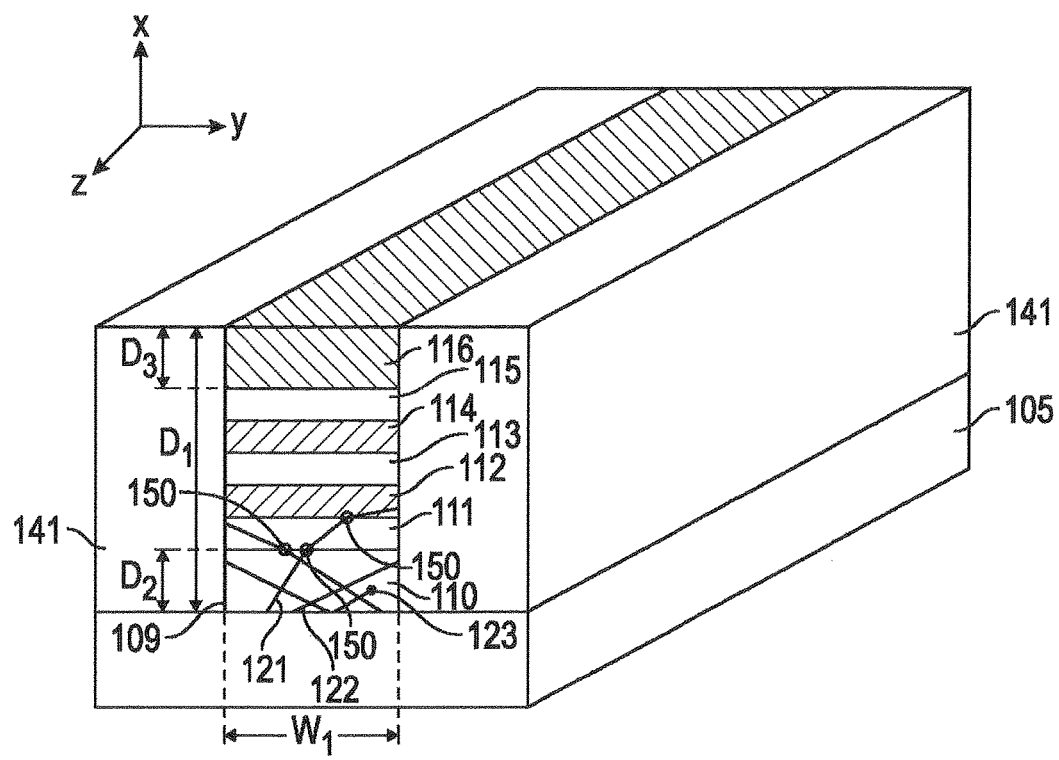
FIG. 1 includes a trench with epitaxial materials in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As mentioned above, ICs are becoming smaller and this presents problems for components of the ICs, such as transistors. Specifically, as the pitch of the elements of a transistor are made increasingly smaller, the source and drain region volume shrinks and providing uniaxial transistor channel stress through the source and drain regions becomes increasingly difficult. Considering stress in the channel region of a transistor can improve transistor performance, devices that incorporate stress into the channel region (without relying on the source and drain regions to supply stress) are useful.

Embodiments described herein provide transistors having channel structures having stress imparted from the substrate (and/or layers on the substrate). Also provided are channel structures comprised of interlayered compressive and tensile layers and methods of making such channel structures. Additional embodiments of the invention provide transistors having a plurality of strained nanoribbons or nanowires in the channel region. Channel structures in these embodiments may be included within aspect ratio trapping (ART) trenches. ART trenches limit epitaxial induced defects to layers below the channel region and within the trench, thereby producing relatively defect free channels that operate more efficiently than would be the case if the channels included defects. Further, in some embodiments the channel structures are strained, thereby allowing for the structures to have significant heights (beyond what would be their traditional critical layer height) while maintaining strain in the channel structure. This allows for poly-gate structures to be built that have channels large enough to provide good switching performance.

FIG. 1 includes an ART trench 109 formed within insulation material (e.g., interlayer dielectric (ILD) 141 and atop substrate 105. Substrate 105 may include, for example, Si. ART is based on threading dislocations that propagate upwards at a specific angle. In ART a trench is made in a first semiconductor (S1) with a high enough aspect ratio such that the defects in a second semiconductor (S2) located in the trench terminate on the sidewall of the trench and any layer above the terminations is relatively defect free. The trench may or may not include a barrier.

Layer 110 is on the substrate 105. The epitaxial material of the layer 110 may have a first lattice constant (distance between atoms in cubic-cell crystals). The material of layer 110 may include, for example, $Si_{1-x}Ge_x$ (e.g., $Si_{0.5}Ge_{0.5}$). Layer 111 may directly contact an upper surface of the layer 110. Layer 111 may include an epitaxial material having a second lattice constant. The material of layer 111 may include, for example, $Si_{(1-y)}Ge_y$ where Y<X (e.g., $Si_{0.7}Ge_{0.3}$). A layer 112, directly contacting an upper surface of the layer 111, includes epitaxial material having a third lattice constant unequal to the second lattice constant. The material of layer 112 may include, for example, $Si_{(1-z)}Ge_z$ where Z>X (e.g., $Si_{0.3}Ge_{0.7}$). Using SiGe materials as an example, the lattice constant for these materials increases as the Ge content increases. Also, the Ge content imparts strain on layers. Thus, layer 111 (using $Si_{(1-y)}Ge_y$, where Y<0.5 as an example) is tensile strained and layer 112 (using $Si_{(1-z)}Ge_z$ where Z>0.5 as an example) is compressive strained.

The device of FIG. 1 further comprises a layer 113 directly contacting an upper surface of the layer 112. Layer 113 includes an epitaxial material having a fourth lattice constant substantially equal to the second lattice constant (of layer 111). Thus, if layer 111 is tensile strained (due to its lattice mismatch with layer 110) then so too is layer 113. Layer 114 directly contacts an upper surface of the layer 113. Layer 114 includes an epitaxial material having a fifth lattice constant substantially equal to the third lattice constant (of layer 112). Thus, if layer 112 is compressive strained (due to its lattice mismatch with first layer 110) then so too is fourth layer 114. In an embodiment layers 111, 113 include the same material (e.g., $Si_{0.7}Ge_{0.3}$) and layers 112, 114 include the same material (e.g., $Si_{0.3}Ge_{0.7}$).

Epitaxial device layer 116 is included on layers 110, 111, 112, 113, 114. Layers 111, 112, 113, 114 comprise alternating oppositely strained layers. If layer 111 is compressive strained then layer 112 is tensile strained and layer 113 is compressive strained. If layer 111 is tensile strained then layer 112 is compressive strained and layer 113 is tensile strained. While layers 111, 112, 113, 114 have been discussed thus far, the number of alternating and oppositely strained layers may be as few as two layers (e.g., layers 111, 112) or may extend to 5, 8, 11, 14 layers or more. For example, layer 115 is shown and includes the same material (and consequently the same lattice constant and the same strain) as layer 113, however many other layers may be included between layer 110 and layer 116.

Device layer 116 includes a channel region and, as will be discussed below, may eventually couple to source and drain regions to provide a transistor.

The "stack", comprised of layers 110, 111, 112, 113, 114, 115, 116, includes a unique combination of attributes that provide many advantages. For example, the first layer 110 is relaxed and includes defects, such as defects 121, 122, 123. Layer 110 is relaxed because its thickness D2 extends beyond the critical layer thickness for layer 110, thereby generating defects that relax lattice mismatch (i.e., mismatch between layer 110 and substrate 105). (Regarding critical layer thickness, if the thickness of an epitaxial layer is kept small enough to maintain elastic strain energy below energy of dislocation formation, the strained-layer structure will be thermodynamically stable against dislocation formation and is said to be below its critical layer thickness. Exceeding the critical layer thickness results in relaxation brought on by defects).

Layer 111 is strained and may or may not include defects, such as defect 121. Layer 112 is strained and may or may not include defects, such as defect 121. Defect 121 extends from layer 110 across the boundary interface between layers 110, 111. At this boundary interface layer 111 "glides" the defect off its linear path and more directly towards a sidewall of trench 109 (see boundary incident areas 150). Defect 121 extends from layer 111 across the boundary interface between layers 111, 112. At the boundary interface layer 112 "glides" the defect off its linear path and even more directly towards a sidewall of trench 109, where it finally terminates. This termination occurs before the defect progresses upwards to device layer 116, which includes "substantially no defects".

A person of ordinary skill in the art will understand "substantially no defects" to not be an absolute term but rather a relative term dictated by, for example, resolution of the imaging source (e.g., transmission electron microscope (TEM)) used to image the layer. For example, "substantially no defects" may be interpreted as less than 1 part per million (ppm).

Furthermore, defect trapping is "2 dimensional" and includes defects trapped in the X-Y plane, such as defects 121, 122, as well as those having an element in the Z plane, such as defect 123 (which is shown projecting out from the page towards the viewer).

In an embodiment the layer 111 includes a lower total number of defects than the layer 110 and a plurality of defects (e.g., defect 122) terminate in the layer 110. Thus, as one moves upwards away from the substrate the defect layer 110 and some or all of the alternating strained layers 111, 112, 113, 114, 115 glide defects towards sidewalls of trench 109 and away from channel portion 116.

In an embodiment, layers 110, 111, 112, 113, 114, 115, 116 are all included in a trench 109 having an aspect ratio (depth $D_1$ to width $W_1$) of at least 2:1, but other embodiments may include ratios of 1.5, 1.7, 1.9, 2.1, 2.3, 2.5, 2.7 and the like.

In an embodiment the first lattice constant for layer 110 is one of being (a) greater than the lattice constant of layer 111 and less than the lattice constant of layer 112, or (b) less than the lattice constant of layer 111 and greater than the lattice constant of layer 112. In other words, if layer 110 is relaxed the layer immediately above it (e.g., layer 111) may be either tensile strained with respect to layer 110 or compressive strained with respect to layer 110. Furthermore, the final layer (e.g., layer 115 in the example of FIG. 1) of alternating oppositely strained layers 111, 112, 113, 114, 115 may be compressive strained or tensile strained, regardless of whether the first strained layer (e.g., layer 111) is compressive strained or tensile strained.

Figure 2:
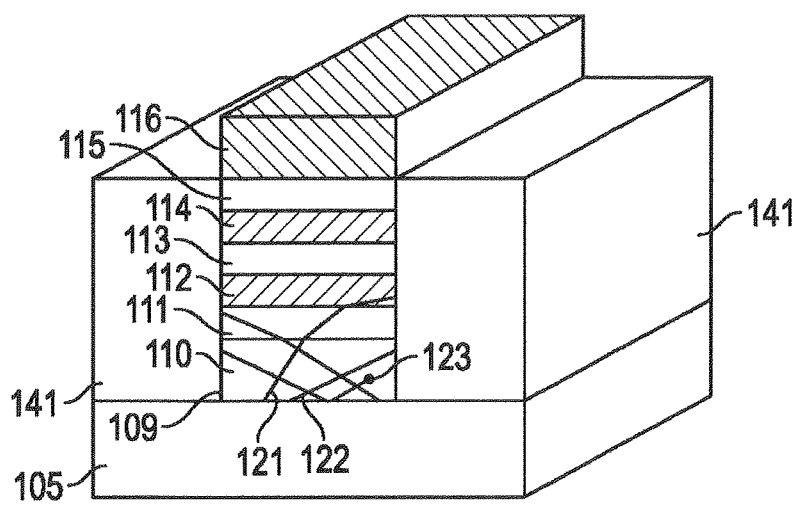
FIG. 2 includes the trench of FIG. 1 with insulator materials partly etched away to expose channel material in an embodiment of the invention.

FIG. 2 illustrates how the structure of FIG. 1 may be further processed. In FIG. 2 portions of insulative material 141 have been recessed to expose sidewalls of channel material 116.

Figure 3:
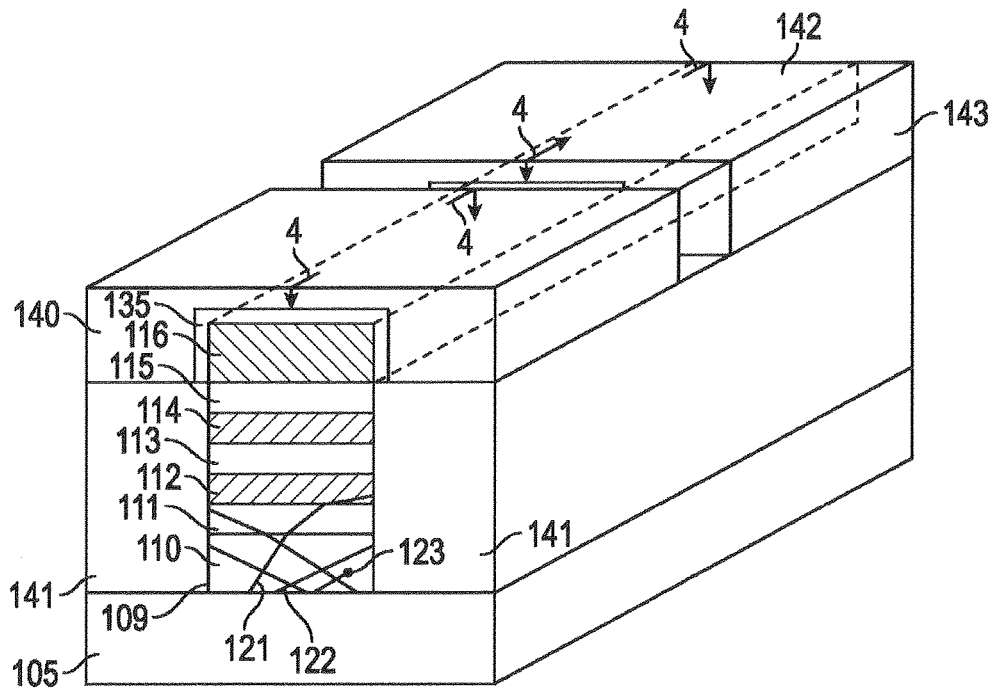
FIG. 3 includes the trench of FIGS. 1 and 2 incorporated into a switching device (e.g., transistor) in an embodiment of the invention.

FIG. 3 illustrates how the structure of FIG. 2 may be further processed. In FIG. 3 the exposed portions of FIG. 2 are now covered with gate dielectric 135 and gate electrode material 140. Further, a source or drain portion 142 is now coupled to source or drain electrode 143. The complementary source/drain node to node 142 is not shown in FIG. 3 but would be on the other side of gate electrode 140 than node 142.

Figure 4:
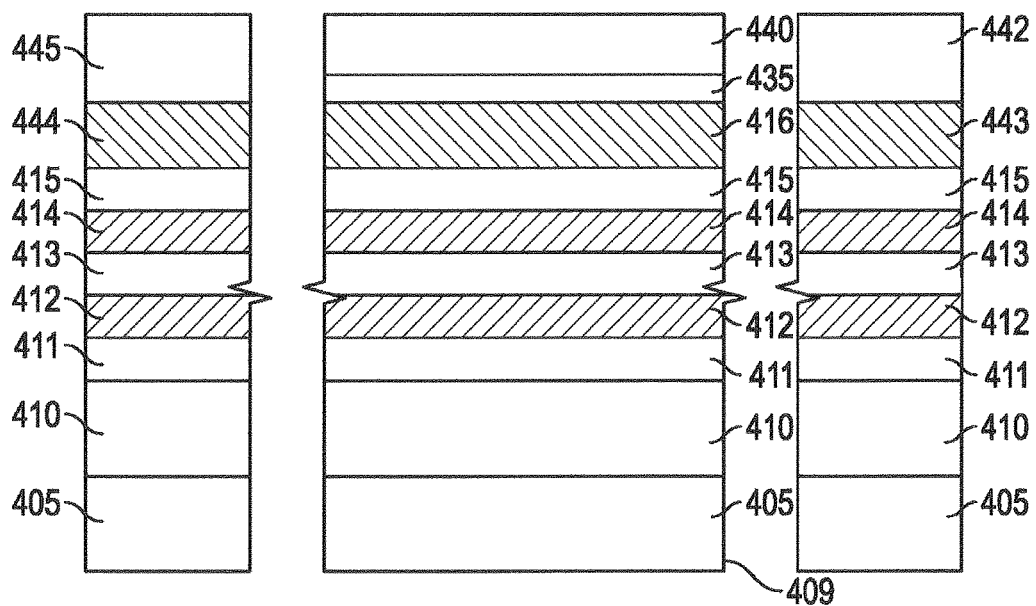
FIG. 4 includes the trench of FIGS. 1 and 2 incorporated into a switching device (e.g., transistor) in an embodiment of the invention.

FIG. 4 includes a side view taken along the lines 4-4 of FIG. 3 to illustrate a side view of the gate structure. As shown in FIG. 3, channel 416 and source/drain node 443, along with their respective electrodes 440, 442 are shown. However, the complementary source/drain node 444 and its electrode 445 are also provided as one example of an architecture including the strain compensated channel 416.

In an embodiment, each of layers 111, 112, 113, 114, 115 include depths or heights less than their respective critical layer thicknesses to prevent generation of defects from within those layers.

In an embodiment the device layer 116, 416 is relaxed and the source and drain regions 443, 444 are negatively doped to produce a NMOS device.

In an embodiment the device layer 416 is tensile strained and the source and drain regions 443, 444 are negatively doped to produce a NMOS device. In an embodiment a layer (e.g., layer 115) directly below the device layer 116 and directly contacting the device layer is tensile strained and the layer 416 is tensile strained. Thus, in an embodiment the device layer need not necessarily be oppositely strained to the layer immediately beneath it.

In an embodiment the device layer 116, 416 is compressive strained and the source and drain regions 443, 444 are positively doped to produce a PMOS device. In an embodiment a layer directly below the device layer 116, 416 and directly contacting the device layer is compressive strained. Thus, in an embodiment the device layer need not necessarily be oppositely strained to the layer immediately beneath it.

In an embodiment, the device layer 116 is thicker than either of layer 111 and layer 112, considering the ability of the oppositely and alternating stained layers to allow the device layer to extend its depth $D_3$ due to its expanded critical layer thickness, which may be less than 50 nm conventionally but is greater than 50 nm in an embodiment. In an embodiment the layer 110 is thicker than either of layer 111 and layer 112 considering the layer 110 is purposely extended beyond its critical layer thickness to generate defects and layers 111, 112, 113, 114, 115 are purposely not extended beyond their respective critical layer thicknesses to avoid generating defects.

In an embodiment layer 111, layer 112, and device layer 116 are all uniaxially strained. By growing the stack within trench 109 strain is retained in the stack whereas some or all of the strain may be lost if the stack were to be etched into a fin from a bidirectionally strained film (due to relaxation along etched edges of the films).

An above example addresses a situation where first layer 110 is $Si_{0.5}Ge_{0.5}$ and layer 111 includes $Si_xGe_{1-x}$ where x>0.5 that is tensile strained and layer 112 includes $Si_yGe_{1-y}$ where y<0.5 that is compressive strained. However, other embodiments are not so limited. For example, the device layer may include a device material, one of the second layer (e.g., layer 111) and the third layer (e.g., layer 112) may be tensile strained (e.g., layer 111) and another of the second and third layers (e.g., layer 112) is compressive strained, and the device material includes a lattice constant unequal to (greater than or less than) either of the lattice constants for the second and third layers (e.g., layers 111, 112). For example, the device layer may include a device material, one of the second and third layers may be tensile strained (e.g., layer 112) and another of the second and third layers (e.g., layer 111) is compressive strained, and the device material includes a lattice constant unequal to (greater than or less than) either of the lattice constants for the second and third layers (e.g., layers 111, 112).

Figure 5:
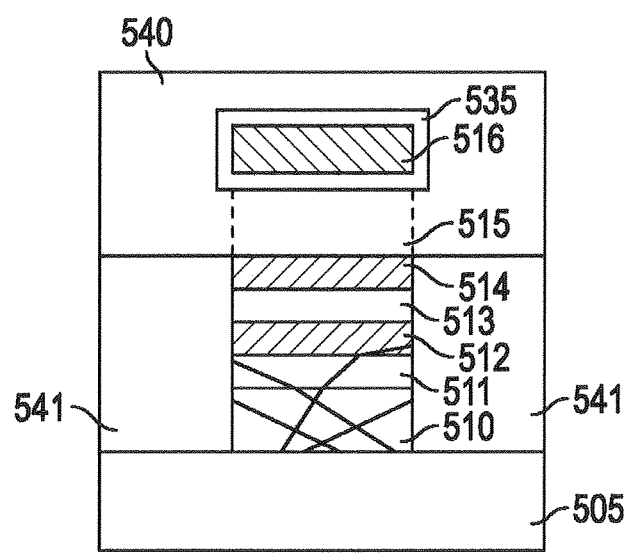
FIG. 5 includes a nanoribbon in an embodiment of the invention.

FIG. 5 includes a nanoribbon in an embodiment of the invention. FIG. 5 includes an ART trench formed within ILD 541 and atop substrate 505. Substrate 505 may include, for example, Si. First layer 510 is on the substrate 505. The first epitaxial material of the first layer may have a first lattice constant (distance between atoms in cubic-cell crystals). The first material may include, for example, $Si_xGe_{1-x}$ (e.g., $Si_{0.5}Ge_{0.5}$). Second layer 511 may include a second epitaxial material having a second lattice constant. The second material may include, for example, $Si_{(1-y)}Ge_y$ where y<0.5 (e.g., $Si_{0.7}Ge_{0.3}$). A third layer 512 includes a third epitaxial material having a third lattice constant unequal to the second lattice constant. The third material may include, for example, $Si_{(1-z)}Ge_z$ where z>0.5 (e.g., $Si_{0.3}Ge_{0.7}$). Using SiGe materials as an example, the lattice constant for these materials increases as the Ge content increases. Also, the Ge content imparts strain on layers. Thus, second layer 511 (using $Si_{(1-y)}Ge_y$ where y<0.5 as an example) is tensile strained and third layer 512 (using $Si_{(1-z)}Ge_z$ where z>0.5 as an example) is compressive strained. Epitaxial device layer 516 is included on layers 510, 511, 512, 513 (e.g., including the same material and lattice constant and strain as layer 511), 514 (e.g., including the same material and lattice constant and strain as layer 512). Layers 511, 512, 513, 514 comprise alternating oppositely strained layers.

While FIG. 5 is similar to FIGS. 1 and 3, FIG. 5 differs in that device layer 516, at at least one point along its length and at least some point during its manufacture, is exposed on all sides. This may be achieved using material specific etching techniques known to those of ordinary skill in the art. Areas, such as area 515, which was occupied by a strained epitaxial layer, may be occupied by gate metal. After exposing layer 516 (thereby making the nanowires or nanoribbons suspended between, for example, source and drain regions or what will eventually be source and drain regions) gate oxide material 535 may be deposited around layer 516 followed by gate metal 540 being formed around gate oxide material 535. This describes the patterning of device layer 516 into a nanoribbon (or if the nanoribbon has an unflattened profile layer 516 the structure may be termed, for example, a nanowire). The nanoribbon of layer 516 is surrounded by a gate to produce an "all around" gate. As with FIG. 3, the channel of layer 516 may be coupled to a source and a drain.

Thus, FIG. 5 shows a transistor structure having a strained nanoribbon channel region (but a nanowire or nanowires is/are included in other embodiments). (In general, a nanowire can be considered to have widths and heights that are approximately equal, and nanoribbons can be considered to have a width that is larger than the height (the length dimension being the dimension along the length of the wire or ribbon)). With the nanoribbon embodiment of FIG. 5 a tensile or compressive layer or layers is etched away to create PMOS (using a compressive strained layer) or NMOS (using a tensile strained layer) nanoribbon channel region(s) that are strained relative to layer 110. In the process of etching away layers to exposed the channel layer (and form the nanoribbon) epitaxial material may be etched away either partially (leaving remnants of, for example, epitaxial layer 515) or completely. The nanowires or nanoribbons may be suspended between, for example, source and drain regions.

Although a single nanoribbon is shown in FIG. 5, other numbers of nanoribbons or nanowires are possible, such as, between and including 1 and 10, between 2 and 10, and between 3 and 10 nanoribbons or nanowires in a transistor, although other numbers are also possible. The number of nanoribbons or nanowires may be formed by removing one or more strained layers in the stack of FIG. 1. For example, a series of nanoribbons may be formed by removing one or more compressive strained layers to yield a series of tensile strained nanoribbons or nanowires. For example, a series of nanoribbons may be formed by removing one or more tensile strained layers to yield a series of compressive strained nanoribbons or nanowires. Source and drain regions may be made to abut the one or more nanoribbons or nanowires. Strained nanoribbons/nanowires (with respect to layer 110 and/or substrate 105) do not require the use of source/drain stressors.

In embodiments, an insulating layer is disposed between nanoribbons or nanowires and/or between nanoribbons or nanowires and the substrate. This insulation may serve as the bottom gate isolation in an "all around" gate.

Figure 6:
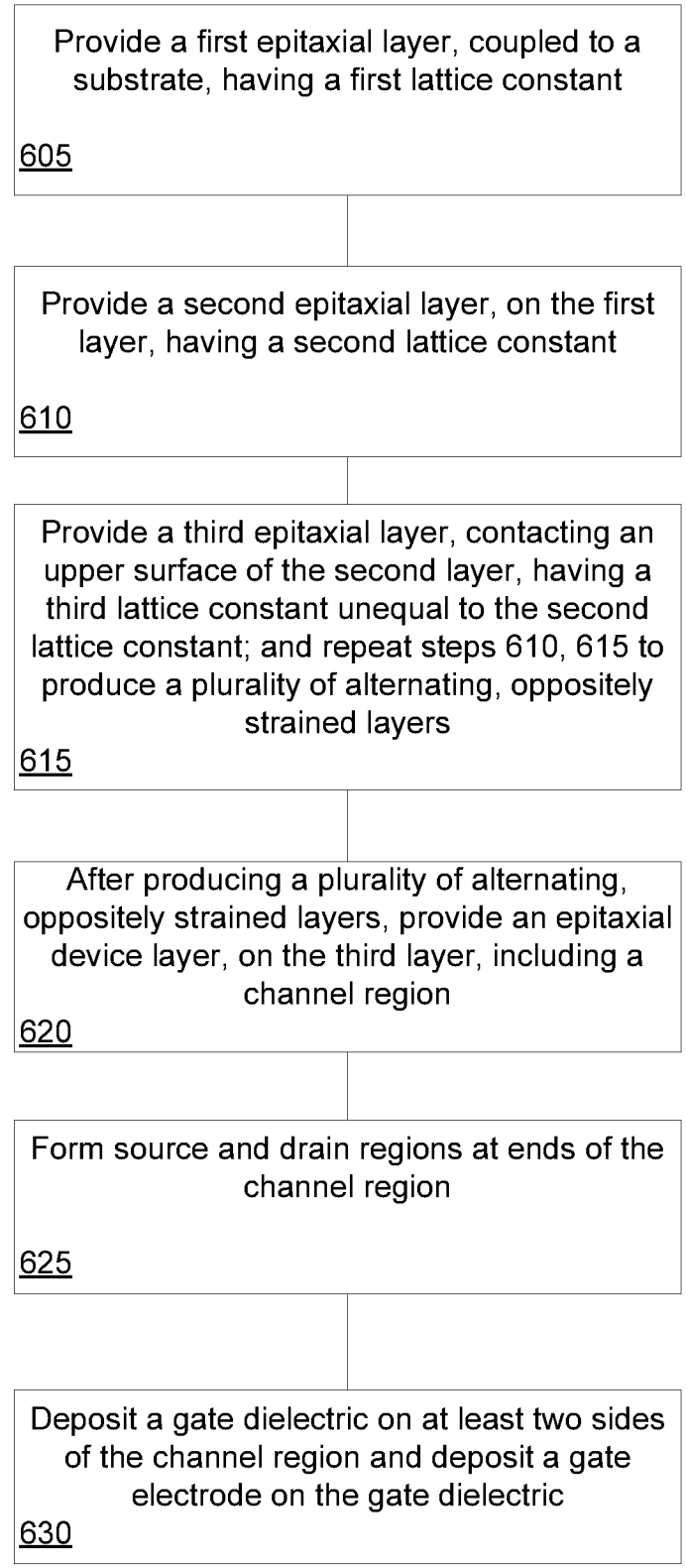
FIG. 6 includes a flow chart describing a method for making a strain compensated transistor in an embodiment of the invention.

FIG. 6 includes a flow chart describing a method for making a strain compensated transistor in an embodiment of the invention. Block 605 includes providing a first epitaxial layer (e.g., layer 110), coupled to a substrate, having a first lattice constant. Block 610 includes providing a second epitaxial layer (e.g., layer 111), on the first layer, having a second lattice constant. Block 615 includes providing a third epitaxial layer (e.g., layer 112), contacting an upper surface of the second layer, having a third lattice constant unequal to the second lattice constant; and repeating steps 610, 615 to produce a plurality of alternating, oppositely strained layers (e.g., layers 113, 114, and/or 115). Block 620 includes, after producing a plurality of alternating, oppositely strained layers, providing an epitaxial device layer, on the third layer, including a channel region (e.g., layer 116). Block 625 includes forming source and drain regions at ends of the channel region. Block 630 includes depositing a gate dielectric on at least two sides of the channel region (e.g., two sides for bigate device and three sides for trigate device) and deposit a gate electrode on the gate dielectric. This method may produce a device wherein (a) the first layer is relaxed and includes defects, (b) the second layer is compressive strained and the third layer is tensile strained, and (c) the first, second, third, and device layers are all included in a trench. This method may produce a device wherein (a) the first layer is relaxed and includes defects, (b) the second layer is tensile strained and the third layer is compressive strained, and (c) the first, second, third, and device layers are all included in a trench.

While above substrate 105 was referred to as including silicon, in other embodiments the material selected for the substrate 105 can be, for example, any material comprising elements from group III, IV, and/or V of the periodic table, and combinations thereof.

In an embodiment, layers 111, 112, 113, 114, 115 are grown below their critical layer thicknesses to ensure that full compressive or tensile strain is preserved in the layers. These alternating oppositely strained layers (alternating between compressive and tensile strain with respect to defect layer 110) can be grown to extremely tall heights with minimal to no strain relaxation. In general, the interlayers 111, 112, 113, 114, 115 can be comprised of pure elements and/or mixtures of elements, such as, for example, Si and Ge, and III-V semiconductor materials (materials comprising elements found in columns III and V of the periodic table). In embodiments of the invention, the channel structures can comprise quantum wells in which a thin device layer is adjacent to or sandwiched between layers having a larger band gap compared to the channel material. The oppositely strained epitaxial interlayers 111, 112, 113, 114, 115 are created through crystal lattice mismatches relative to the crystal lattice of layer 110.

In embodiments, the substrate include SiGe, layer 110 is comprised of $Si_XGe_{1-X}$, layer 111 is comprised of $Si_YGe_{1-Y}$ where Y>X, and layer 112 is comprised of $Si_ZGe_{1-Z}$ where Z<X, 1>X≥0.

In embodiments, the substrate 105 and/or layer 110 are comprised of InP (albeit in possibly different compositions of InP), layer 111 is comprised of $In_XGa_{1-X}As$ where 1≥X>0.53, and layer 112 is comprised of $In_YGa_{1-Y}As$ where 0.53>Y≥0.

In embodiments, the substrate 105 and/or layer 110 is comprised of GaSb (albeit in possibly different compositions of GaSb), layer 111 is comprised of AlSb, and layer 112 is comprised of InAs.

In embodiments, the substrate 105 and/or layer 110 is comprised of Ge (while layer 110 may include some impurities so it is lattice mismatched with substrate 105), layer 111 is comprised of $Si_XGe_{1-X}$, and layer 112 is comprised of $In_YGa_{1-Y}As$ where 1≥X>0 and 1≥Y>0.

In embodiments, the substrate 105 and/or layer 110 is GaAs (albeit in possibly different compositions of GaAs), layer 111 is $GaAs_XP_{1-X}$ where X is a number between 1 and 0, and layer 112 is $In_YGa_{1-Y}P$ where 1≥Y>0.51.

Using epitaxial interlayered structures, comprising alternating layers of compressively and tensilely strained epitaxial materials, allows for channel structures that preserve strain in the layers while having larger heights than conventional methods of producing strain in channel regions of transistors. In embodiments of the invention, channel regions of transistors have heights that range between 10 nm and 100 nm or between 25 nm and 85 nm, although other heights are also possible. Although five layers of oppositely strained epitaxial interlayers 111, 112, 113, 114, 115 are shown in FIG. 1, it is also possible to have other numbers of such layers such as, for example, between and including 3 and 25 layers or between 5 and 25 layers, although other numbers are also possible.

In FIG. 4, source and drain regions 443, 444 abut ends of the channel region 416. In embodiments of the invention, the channel strain with respect to layer 110 is maintained in the channel region and does not require the use of source/drain materials that create strain in the channel.

In an embodiment insulating spacers may abut the gate dielectric 135 and the gate electrode 140.

While FIG. 3 discloses a trigate, other embodiments may include a bigate (dual gate) transistor structure having a strained channel region. For example, the bigate may be formed along the sidewalls of channel layer 116 but not along the top of channel layer 116.

Just as bigate, trigate, and "all around" gates are described above, an embodiment includes a single gate transistor structure having a strained channel region. Other structures are also possible for single gate transistors, such as, ones having features that are differently oriented relative to one another and structures having features with different shapes and/or sizes. For example, single gate transistor structures having source and drain regions that are not recessed relative to the channel region are also possible.

The epitaxial materials described herein (e.g., layers 110, 111, 112, 113, 114, 115, 116) can be deposited, for example, by ultra-high vacuum chemical vapor deposition (UHV-CVD), rapid-thermal chemical vapor deposition (RTCVD), or molecular beam epitaxy (MBE). Alternating layers of epitaxial tensilely and compressively strained materials (materials having smaller and larger lattice constants relative to the defect layer 110, respectively) are deposited onto the substrate to create a stack of layers. During the manufacture of the channel region of a transistor, the tensile and compressive interlayers (layers that are strained in the opposite direction and adjacent to each other) are more stable against relaxation because dislocations that would form to relax one layer would increase strain in the other. Because the relaxation requirements of the balanced stack system are opposing, a larger total critical thickness for the channel region can be created. Generally, a single film stack that does not use strain compensation cannot grow without relaxation or defect formation beyond 50 nm tall for lattice mismatches greater than 1.3%. In embodiments of the invention, a stack of layers can have from 3 to 25 layers or from 5 to 25 layers and/or a height of 10 nm and 100 nm or between 25 nm and 85 nm. The structure comprising oppositely strained interlayers may be included into fins for a finfet structure.

In embodiments, gate dielectric materials include, for example, insulating materials, such as, silicon dioxide ($SiO_2$), silicon oxynitride, silicon nitride, and/or high-k dielectric materials. In general, a high-k dielectric is a dielectric material having a dielectric constant greater than that of $SiO_2$. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art.

In an embodiment, gate electrode materials include, for example, materials such as Ti, W, Ta, Al, and alloys thereof, and alloys with rare earth elements, such as Er, Dy or noble metals such as Pt, and nitrides such as TaN, and TiN.

In an embodiment, materials for sources and/or drains include, for example, Si, carbon doped Si, and phosphorus doped Si, for NMOS, and boron doped $Si_xGe_{1-x}$, boron doped Ge, boron doped $Ge_xSn_{1-x}$, and p-doped III-V compounds for PMOS applications.

Typical dielectric materials used for dielectric layers, features, and/or ILD include silicon dioxide and low-k dielectric materials. Additional dielectric materials that may be used include, carbon doped oxide (CDO), silicon nitride, silicon oxyntiride, silicon carbide, organic polymers such as perfluorocyclobutane or polytetrafluoroethylene, fluorosilicate glass (FSG), and/or ganosilicates such as silsesquioxane, siloxane, or organosilicate glass. The dielectric layer may include pores to further reduce the dielectric constant.

Devices shown herein can comprise additional structures, such as insulating layers enclosing devices, additional substrate layers, metal trenches and vias connecting sources and drains to other components of an IC device, and other additional layers and/or devices. Components illustrated as one layer for simplicity, can comprise a plurality of layers of the same or a different material depending, for example, on the manufacturing processes employed in constructing the device and the desired properties of the device.

Implementations of the invention are housed on a substrate, such as a semiconductor wafer. Substrate surfaces on which transistor structures according to embodiments of the invention can be formed include, for example, H-terminated silicon, silicon dioxide, silicon, silicon germanium, a group III-V (or a group 13-14 in additional periodic table column numbering schemes) compound semiconductor, a main-group oxide, a metal, and/or a binary or mixed metal oxide. Layers and layers comprising devices can also be described as the substrate or part of the substrate on which embodiments of the invention are fabricated. The substrate base on which semiconductor devices are built is typically a semiconductor wafer that is diced apart to yield individual IC chips. The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and/or other group III-V materials either alone or in combination with silicon or silicon dioxide or other insulating materials. A substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a device comprising: a silicon substrate having a substrate lattice constant; first layer, on the substrate, including a first epitaxial material having a first lattice constant; a second layer, directly contacting an upper surface of the first layer, including a second epitaxial material having a second lattice constant; a third layer, directly contacting an upper surface of the second layer, including a third epitaxial material having a third lattice constant unequal to the second lattice constant; and an epitaxial device layer, on the third layer, including a channel region coupled to source and drain regions; wherein (a) the first layer is relaxed and includes defects, (b) the second layer is strained and includes defects, (c) the third layer is strained, (d) the device layer includes substantially no defects, (e) the first, second, third, and device layers are all included in a trench having an aspect ratio (depth to width) of at least 2:1, and (f) the first lattice constant is one of (f)(i) greater than the second lattice constant and less than the third lattice constant, and (f)(ii) less than the second lattice constant and greater than the third lattice constant.

In example 2 the subject matter of the Example 1 can optionally include a fourth layer, directly contacting an upper surface of the third layer, including a fourth epitaxial material having a fourth lattice constant substantially equal to the second lattice constant; and a fifth layer, directly contacting an upper surface of the fourth layer, including a fifth epitaxial material having a fifth lattice constant substantially equal to the third lattice constant; wherein the fourth and fifth layers are each strained and the device layer is on the fifth layer.

In example 3 the subject matter of the Examples 1-2 can optionally include wherein the device layer directly contacts the fifth layer.

In example 4 the subject matter of the Examples 1-3 can optionally include wherein the device layer is relaxed and the source and drain regions are negatively doped.

In example 5 the subject matter of the Examples 1-4 can optionally include wherein the device layer is compressive strained and the source and drain regions are positively doped.

In example 6 the subject matter of the Examples 1-5 can optionally include wherein a layer directly below the device layer and directly contacting the device layer is compressive strained.

In example 7 the subject matter of the Examples 1-6 can optionally include wherein the device layer is tensile strained and the source and drain regions are negatively doped.

In example 8 the subject matter of the Examples 1-7 can optionally include, wherein a layer directly below the device layer and directly contacting the device layer is tensile strained.

In example 9 the subject matter of the Examples 1-8 can optionally include wherein the second layer includes a lower total number of defects than the first layer and a plurality of defects terminate in the first layer.

In example 10 the subject matter of the Examples 1-9 can optionally include wherein the device layer is thicker than either of the second and third layers.

In example 11 the subject matter of the Examples 1-10 can optionally include wherein the device layer has a critical layer greater than 50 nm.

In example 12 the subject matter of the Examples 1-11 can optionally include wherein the first layer is thicker than either of the second and third layers.

In example 13 the subject matter of the Examples 1-12 can optionally include wherein a defect in the second layer extends from a bottom surface of the second layer to a sidewall of the trench terminating at the sidewall.

In example 14 the subject matter of the Examples 1-13 can optionally include wherein the second, third, and device layers are all uniaxially strained.

In example 15 the subject matter of the Examples 1-14 can optionally include wherein the first layer directly contacts an upper surface of the substrate and the first lattice constant is unequal to the substrate lattice constant.

In example 16 the subject matter of the Examples 1-15 can optionally include wherein the device layer includes Ge, the first layer includes $Si_{1-x}Ge_x$, one of the second and third layers is tensile strained and includes $Si_{1-y}Ge_y$ where Y<X and another of the second and third layers is compressive strained and includes $Si_{1-z}Ge_z$ where Z>X.

Various embodiments comprise differing materials combinations such as, for example and without limitation, the following combinations:

| | | | | | |
|---|---|---|---|---|---|
| Layer 110 | $Si_xGe_{1-x}$ | InP | GaSb | Ge | GaAs |
| Layer 111 | $Si_yGe_{1-y}$ where Y > X | $In_xGa_{1-x}As$ where X >0.53 | AlSb | $Si_XGe_{1-x}$ | $GaAs_xP_{1-x}$ |
| Layer 112 | $Si_zGe_{1-z}$ where Z < X | $In_yGa_{1-y}As$ where Y <0.53 | InAs | $In_yGa_{1-y}As$ | $In_yGa_{1-y}P$ where Y >0.51 |

In example 17 the subject matter of the Examples 1-16 can optionally include wherein the device layer includes a device material, one of the second and third layers is tensile strained and another of the second and third layers is compressive strained, and the device material includes a lattice constant unequal to either of the first and second lattice constants.

In example 18 the subject matter of the Examples 1-17 can optionally include a gate region disposed on at least two sides of the channel region, wherein the gate region comprises a gate dielectric material disposed between a gate electrode material and the channel region.

In example 19 the subject matter of the Examples 16-18 can optionally include wherein the channel region is comprised of at least one of a nanowire and a nanoribbon, and the device further comprises a gate region disposed on four sides of the at least one of a nanowire and a nanoribbon.

Example 20 includes a device comprising: a first epitaxial layer, coupled to a substrate, having a first lattice constant; a second epitaxial layer, on the first layer, having a second lattice constant; a third epitaxial layer, contacting an upper surface of the second layer, having a third lattice constant unequal to the second lattice constant; and an epitaxial device layer, on the third layer, including a channel region; wherein (a) the first layer is relaxed and includes defects, (b) the second layer is compressive strained and the third layer is tensile strained, and (c) the first, second, third, and device layers are all included in a trench.

In example 21 the subject matter of the Example 20 can optionally include source and drain regions coupled to the channel region, wherein the device layer is one of (a) compressive strained with the source and drain regions being positively doped, and (b) tensile strained with the source and drain regions being negatively doped.

In example 22 the subject matter of the Examples 20-21 can optionally include wherein the device layer is thicker than either of the second and third layers and the second, third, and device layers are all uniaxially strained.

Example 23 includes a method for forming the channel region of a transistor comprising: providing a first epitaxial layer, coupled to a substrate, having a first lattice constant; providing a second epitaxial layer, on the first layer, having a second lattice constant; providing a third epitaxial layer, contacting an upper surface of the second layer, having a third lattice constant unequal to the second lattice constant; and providing an epitaxial device layer, on the third layer, including a channel region; forming source and drain regions at ends of the channel region, depositing a gate dielectric on at least two sides of the channel region, and depositing a gate electrode on the gate dielectric; wherein (a) the first layer is relaxed and includes defects, (b) the second layer is compressive strained and the third layer is tensile strained, and (c) the first, second, third, and device layers are all included in a trench.

In example 24 the subject matter of the Example 23 can optionally include wherein the device layer is one of (a) compressive strained with the source and drain regions being positively doped, and (b) tensile strained and the source and drain regions being negatively doped.

In example 24 the subject matter of the Example 23 can optionally include wherein the device layer is thicker than either of the second and third layers and the second, third, and device layers are all uniaxially strained.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. A device comprising:
a silicon substrate having a substrate lattice constant;
a first layer, on the substrate, including a first epitaxial material having a first lattice constant;
a second layer, directly contacting an upper surface of the first layer, including a second epitaxial material having a second lattice constant;
a third layer, directly contacting an upper surface of the second layer, including a third epitaxial material having a third lattice constant unequal to the second lattice constant; and an epitaxial device layer, on the third layer, including a channel region coupled to source and drain regions;

wherein (a) the first layer is relaxed and includes defects, (b) the second layer is strained and includes defects, (c) the third layer is strained, (d) the device layer includes substantially no defects, (e) the first, second, and third layers are all included in a trench having an aspect ratio (depth to width) of at least 2:1, and (f) the first lattice constant is one of (0(i) greater than the second lattice constant and less than the third lattice constant, and (f)(ii) less than the second lattice constant and greater than the third lattice constant.

2. The device of claim 1 comprising:
a fourth layer, directly contacting an upper surface of the third layer, including a fourth epitaxial material having a fourth lattice constant substantially equal to the second lattice constant; and
a fifth layer, directly contacting an upper surface of the fourth layer, including a fifth epitaxial material having a fifth lattice constant substantially equal to the third lattice constant;
wherein the fourth and fifth layers are each strained and the device layer is on the fifth layer.

3. The device of claim 2, wherein the device layer directly contacts the fifth layer.

4. The device of claim 1, wherein the device layer is relaxed and the source and drain regions are negatively doped.

5. The device of claim 1, wherein the device layer is compressive strained and the source and drain regions are positively doped.

6. The device of claim 5, wherein a layer directly below the device layer and directly contacting the device layer is compressive strained.

7. The device of claim 1, wherein the device layer is tensile strained and the source and drain regions are negatively doped.

8. The device of claim 7, wherein a layer directly below the device layer and directly contacting the device layer is tensile strained.

9. The device of claim 1, wherein the second layer includes a lower total number of defects than the first layer and a plurality of defects terminate in the first layer.

10. The device of claim 1, wherein the device layer is thicker than either of the second and third layers.

11. The device of claim 10, wherein the device layer has a critical layer greater than 50 nm.

12. The device of claim 10, wherein the first layer is thicker than either of the second and third layers.

13. The device of claim 1, wherein a defect in the second layer extends from a bottom surface of the second layer to a sidewall of the trench terminating at the sidewall.

14. The device of claim 1, wherein second, third, and device layers are all uniaxially strained.

15. The device of claim 1 wherein the first layer directly contacts an upper surface of the substrate and the first lattice constant is unequal to the substrate lattice constant.

16. The device of claim 1 wherein the device layer includes Ge, the first layer includes $Si_{1-x}Ge_x$, one of the second and third layers is tensile strained and includes $Si_{1-y}Ge_y$ where Y<X and another of the second and third layers is compressive strained and includes $Si_{1-z}Ge_z$ where Z>X.

17. The device of claim 1 wherein the device layer includes a device material, one of the second and third layers is tensile strained and another of the second and third layers is compressive strained, and the device material includes a lattice constant unequal to either of the first and second lattice constants.

18. The device of claim 1 comprising a gate region disposed on at least two sides of the channel region, wherein the gate region comprises a gate dielectric material disposed between a gate electrode material and the channel region.

19. The device of claim 1, wherein the channel region is comprised of at least one of a nanowire and a nanoribbon and the device further comprises a gate region disposed on four sides of the at least one of a nanowire and a nanoribbon.

20. A device comprising: a first epitaxial layer, coupled to a substrate, having a first lattice constant; a second epitaxial layer, on the first epitaxial layer, having a second lattice constant; a third epitaxial layer, contacting an upper surface of the second epitaxial layer, having a third lattice constant unequal to the second lattice constant; and wherein (a) the first epitaxial layer is relaxed and includes defects, (b) the second epitaxial layer is compressive strained and the third epitaxial layer is tensile strained, and (c) the first epitaxial, second epitaxial, and third epitaxial layers are all included in a trench.

21. The device of claim 20 comprising source and drain regions coupled to the channel region, wherein the device layer is one of (a) compressive strained with the source and drain regions being positively doped, and (b) tensile strained with the source and drain regions being negatively doped.

22. The device of claim 21, wherein the device layer is thicker than either of the second and third layers and the second, third, and device layers are all uniaxially strained.

23. A method for forming the channel region of a transistor comprising: providing a first epitaxial layer, coupled to a substrate, having a first lattice constant; providing a second epitaxial layer, on the first epitaxial layer, having a second lattice constant; providing a third epitaxial layer, contacting an upper surface of the second epitaxial layer, having a third lattice constant unequal to the second lattice constant; and providing an epitaxial device layer, on the third epitaxial layer, including a channel region; forming source and drain regions at ends of the channel region, depositing a gate dielectric on at least two sides of the channel region, and depositing a gate electrode on the gate dielectric; wherein (a) the first epitaxial layer is relaxed and includes defects, (b) the second epitaxial layer is compressive strained and the third epitaxial layer is tensile strained, and (c) the first epitaxial, second epitaxial, and third epitaxial layers are all included in a trench.

24. The method of claim 23 wherein:
the epitaxial device layer is one of (a) compressive strained with the source and drain regions being positively doped, and (b) tensile strained and the source and drain regions being negatively doped; and
the trench has first and second sidewalls that oppose one another;
the first sidewall has a first face that opposes a second face of the second sidewall;
the first and second faces each include a dielectric material.

25. The method of claim 24, wherein the epitaxial device layer is thicker than either of the second and third layers and the second, third, and device layers are all uniaxially strained.

* * * * *